United States Patent [19]
Verhovsky

[11] Patent Number: 5,980,187
[45] Date of Patent: Nov. 9, 1999

[54] MECHANISM FOR TRANSPORTING SEMICONDUCTOR-PROCESS MASKS

[75] Inventor: Yuli Verhovsky, Redwood City, Calif.

[73] Assignee: KLA-Tencor Corporation, San Jose, Calif.

[21] Appl. No.: 08/839,287

[22] Filed: Apr. 17, 1997

[51] Int. Cl.⁶ .................................................. B65G 1/06
[52] U.S. Cl. .................... 414/416; 294/86.4; 294/103.1; 414/225.01; 414/741; 901/39
[58] Field of Search ........................... 414/225, 416, 414/741, 941, 937, 225.01; 901/31, 39; 294/103.1, 104, 86.4

[56] References Cited

U.S. PATENT DOCUMENTS

| | | | |
|---|---|---|---|
| 4,586,743 | 5/1986 | Edwards et al. | 414/941 X |
| 4,632,623 | 12/1986 | Naumec et al. | 294/103.1 X |
| 4,682,928 | 7/1987 | Foulke et al. | 414/941 X |
| 4,813,732 | 3/1989 | Klem | 414/941 X |
| 4,900,214 | 2/1990 | Ben | 414/941 X |
| 4,907,834 | 3/1990 | dejong et al. | 901/39 X |
| 4,944,650 | 7/1990 | Matsumoto | 294/103.1 X |
| 4,981,409 | 1/1991 | Hirose et al. | 414/225 |
| 4,984,953 | 1/1991 | Nakazato et al. | 414/225 X |
| 5,022,695 | 6/1991 | Ayers | 414/941 X |
| 5,133,635 | 7/1992 | Malin et al. | 414/941 X |
| 5,520,501 | 5/1996 | Kouno et al. | 414/941 X |
| 5,590,996 | 1/1997 | Thompson et al. | 414/941 X |

FOREIGN PATENT DOCUMENTS

| | | | |
|---|---|---|---|
| 0045174 | 2/1982 | European Pat. Off. | 294/86.4 |
| 257347 | 10/1989 | Japan | 294/86.4 |
| 1313703 | 5/1987 | U.S.S.R. | 901/39 |
| 94019821 | 9/1994 | WIPO | 414/941 |

*Primary Examiner*—David A. Bucci
*Attorney, Agent, or Firm*—Skjerven, Morrill, MacPherson, Franklin & Friel LLP

[57] ABSTRACT

A system for transporting an article between a loading station and an inspection stage includes a novel support for safely retaining the article during transit. The support includes a number of article-retaining members, at least one of which is connected to an actuator. The actuator clamps the article between the article-retaining members during transit. To ensure that the article is not dropped or damaged during transit, the system includes an un-clamp sensor connected to at least one of the article-retaining members. The un-clamp sensor is connected to a robot controller so that the system may be shut down immediately should the article become unclamped during transit. The system also includes novel loading and inspection stages that ensure proper orientation and placement of articles prior to transit from one to the other, further reducing risk of damage to transported articles.

28 Claims, 15 Drawing Sheets

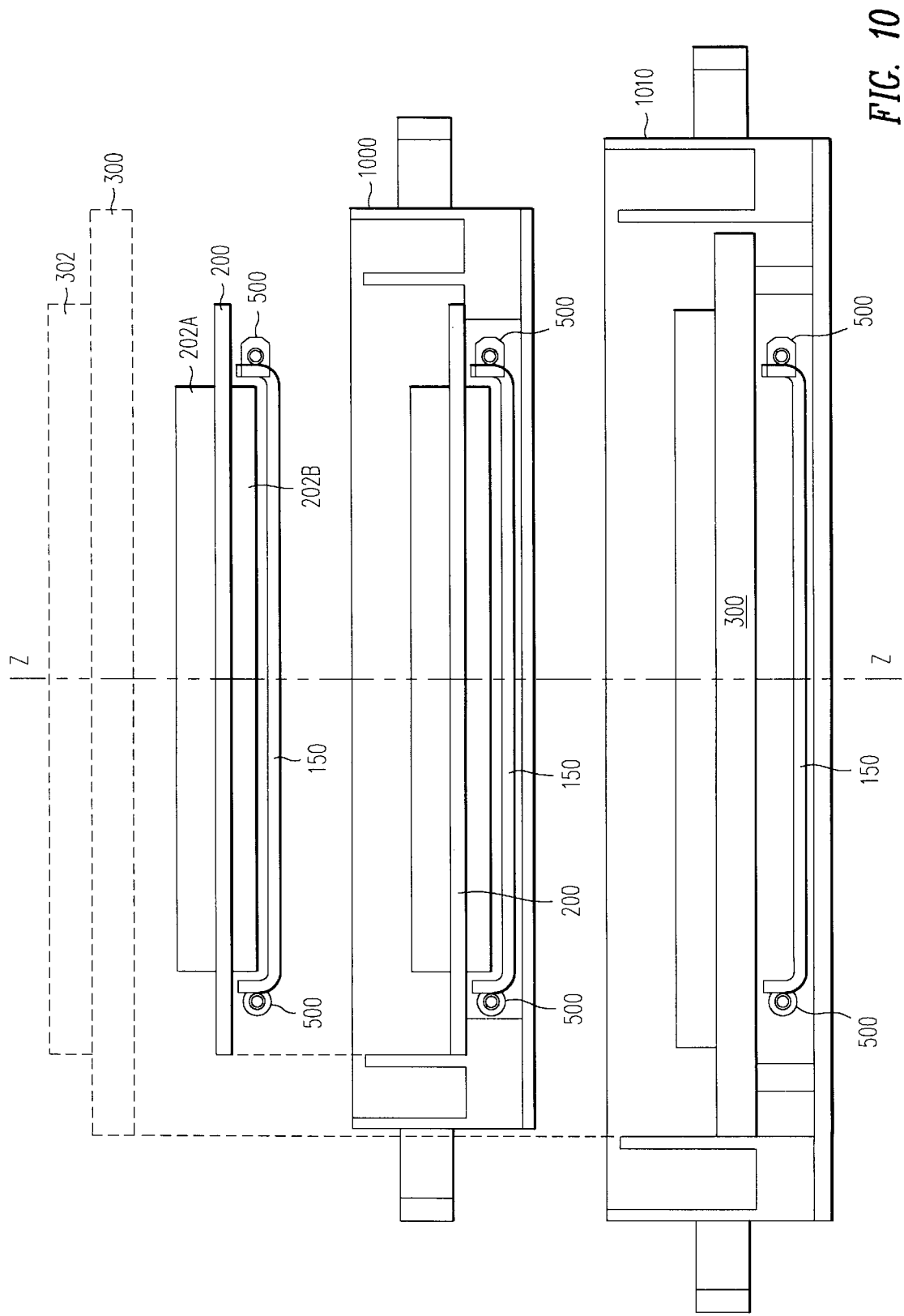

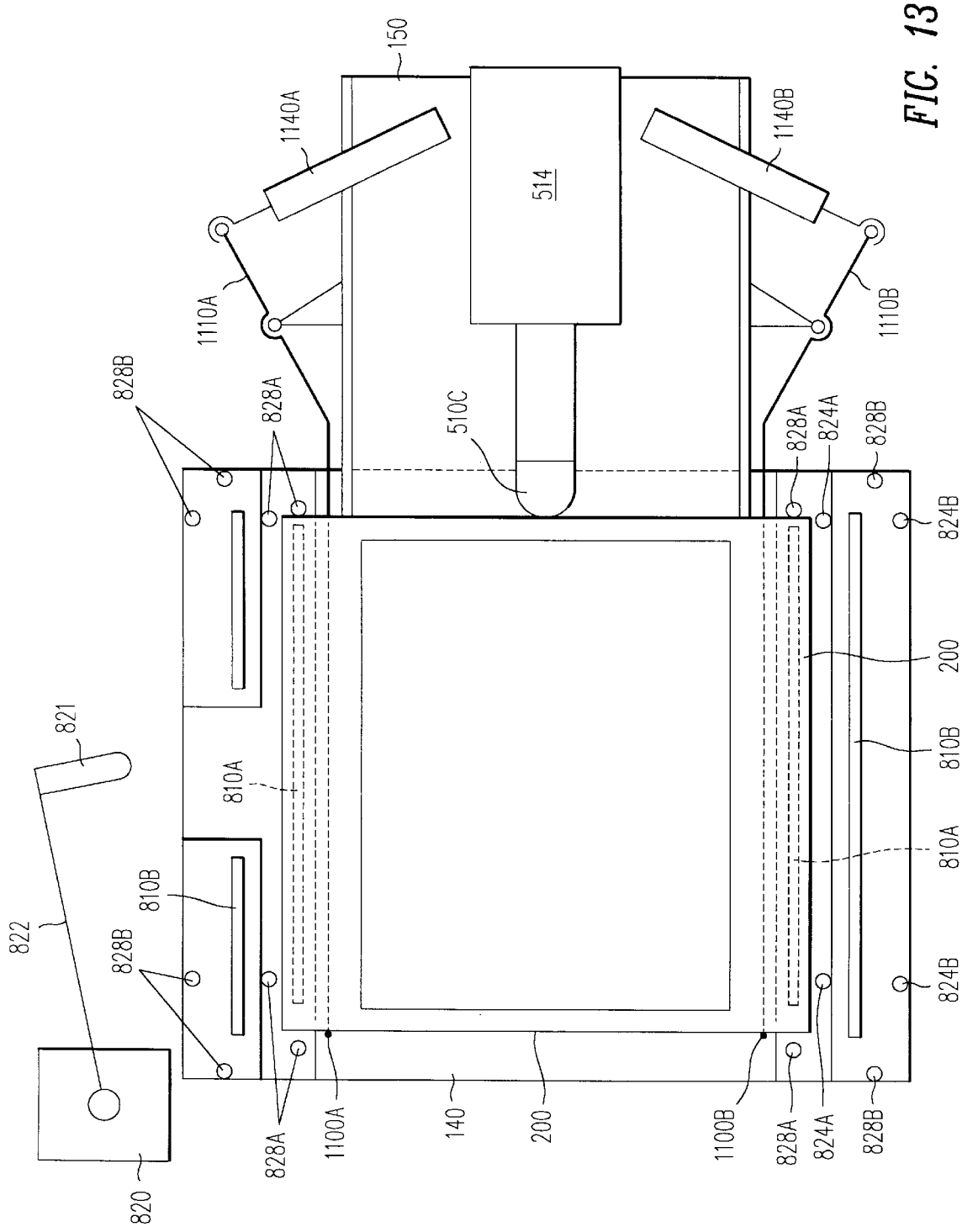

MECHANISM FOR TRANSPORTING SEMICONDUCTOR-PROCESS MASKS

BACKGROUND

1. Field of the Invention

The present invention relates to devices for automatically transporting delicate articles, such as reticles, masks, or wafers.

2. Description of Prior Art

Integrated circuits are made by photolithographic processes that use photo masks (or reticles) and an associated light source to project a circuit image onto a silicon wafer. High production yields are contingent on the creation and maintenance of defect-free masks. Unfortunately, mask defects are inevitable, and must therefore be found and repaired before such defects result in the manufacture of defective integrated circuits.

Due to their extraordinary precision and complexity, masks used to produce integrated circuits are very expensive. It is therefore of paramount importance that such masks are handled with extreme care, for even the least mask defect can render a mask useless.

Some conventional systems for handling masks (e.g., systems for loading masks onto inspection stages of mask-inspection systems) rely on the diligence of a human operator for handling. Others systems use robots for some tasks; however, such systems still rely on human operators because the mask must be correctly placed onto a robot loading station. Unfortunately, people are relatively slow, quickly fatigued by repetitive tasks, and frequently introduce handling and placement errors that are potentially catastrophic. Software glitches and mechanical errors introduced by conventional robots are also a source of error. These human, mechanical, and software errors should be minimized.

Some automated mask-transfer systems are adapted to work with conventional protective cassettes that contain the masks. Such mask-transfer systems are capable of removing masks from cassettes and transferring the masks to another location (e.g., onto an inspection stage). Systems that employ cassettes still rely upon the diligence of human operators for correct mask placement. The mask must be correctly oriented within the cassette, and the cassette must be correctly placed on the loading station. In either case, the failure of the human operator to correctly position the mask can result in mask damage. And, in those systems that employ robots, software or mechanical glitches may also result in mask damage.

Semiconductor manufacturers have made it clear that mask transfer systems that damage masks are unacceptable. There is therefore a need in the art for a reliable automated mask-transfer system that ensures correct mask orientation and that transfers masks without appreciable risk of mask damage.

SUMMARY

The present invention satisfies the need for a safe, reliable, automated mask-transfer system. A mask-transfer system in accordance with the present invention includes a novel mask support for safely retaining a mask during transit from a loading station to an inspection stage.

The mask support includes a number of mask-retaining members, at least one of which is connected to an actuator. The actuator clamps the mask between the mask-retaining members during transit. To ensure that the mask is not dropped or damaged, the mask support includes an un-clamp sensor connected to at least one of the mask-retaining members. The un-clamp sensor is connected to a robot controller so that the system may be shut down immediately should the mask become unclamped during transit.

The mask-transfer system also includes novel loading and inspection stages that ensure proper mask placement prior to transit from one to the other, further reducing risk of mask damage.

The claims, and not this summary, define the scope of the invention.

BRIEF DESCRIPTION OF THE FIGURES

These and other features, aspects, and advantages of the present invention will become better understood with regard to the following description, appended claims, and accompanying figures, where:

FIG. 10 depicts frontal views (from the direction of robot 130) of a five-inch mask cartridge 1000 and a six-inch mask cartridge 1010.

FIG. 13 is a top view of mask support 150 positioning mask 300 onto vacuum slots 210A of inspection stage 140.

DETAILED DESCRIPTION

Figure 1:
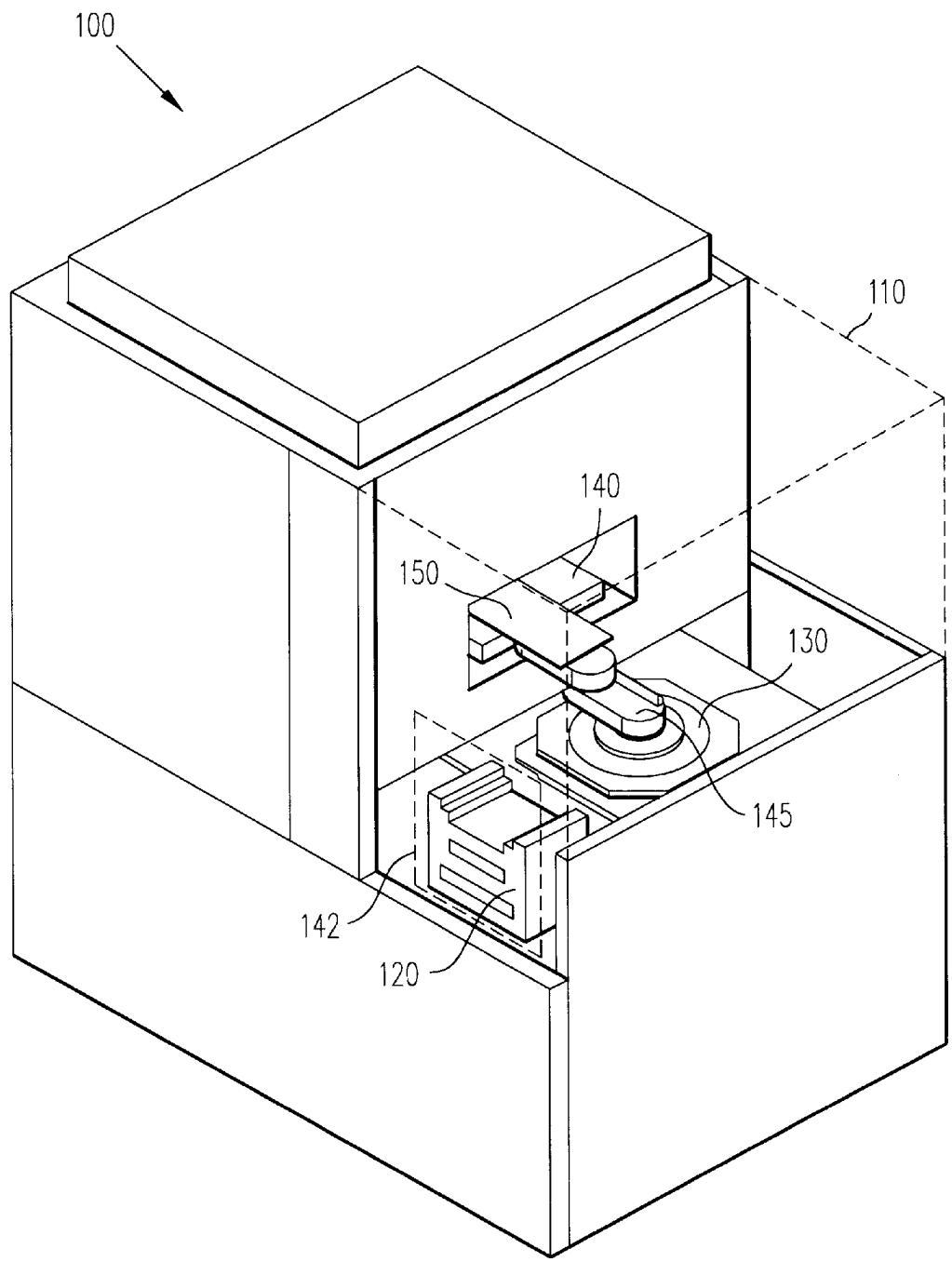
FIG. 1 depicts a mask-inspection system 100 that includes an automated mask-transfer system in accordance with the present invention.

FIG. 1 depicts a mask-inspection system 100 that includes an automated mask-transfer system in accordance with the present invention. The mask-transfer system is enclosed within a housing 110, and includes a loading station 120 and a robot 130. Robot 130 is configured to transfer a mask from loading station 120 to an inspection stage 140 within inspection system 100. Housing 110, typically of tinted plexiglass, protects the mask-transfer system and inspection stage 140 from contamination. Housing 110 includes an access opening 142 through which masks may be loaded and unloaded onto loading station 120. Opening 142 is fitted with an access door and a conventional light curtain (not shown) that signals robot 130 to stop immediately should the light curtain be interrupted during a mask-transfer operation.

Robot 130 is, in one embodiment, a wafer and substrate handling system available from Equipe Technology of Sunnyvale, Calif. Robot 130 includes a transfer arm 145 with a mask support 150. Mask support 150 holds a mask securely during transfer from loading station 120 to inspection stage 140. Robot 130 as purchased includes a conventional robot controller (not shown).

Loading station 120, inspection stage 140, and mask support 150 each include optical sensors that provide information, such as mask location, size, and orientation, to the robot controller. As discussed below in detail, this information enables inspection system 100 to accommodate differently sized masks, transfer masks with minimal danger of damage, and "remember" the position and placement of a mask, if any, in the event of a shut down (e.g., due to a power failure). All optical sensors discussed herein are available from Sunx, Inc., of West Des Moines, Iowa, and from Honeywell, Inc., of Freeport, Ill.

Figure 2A:
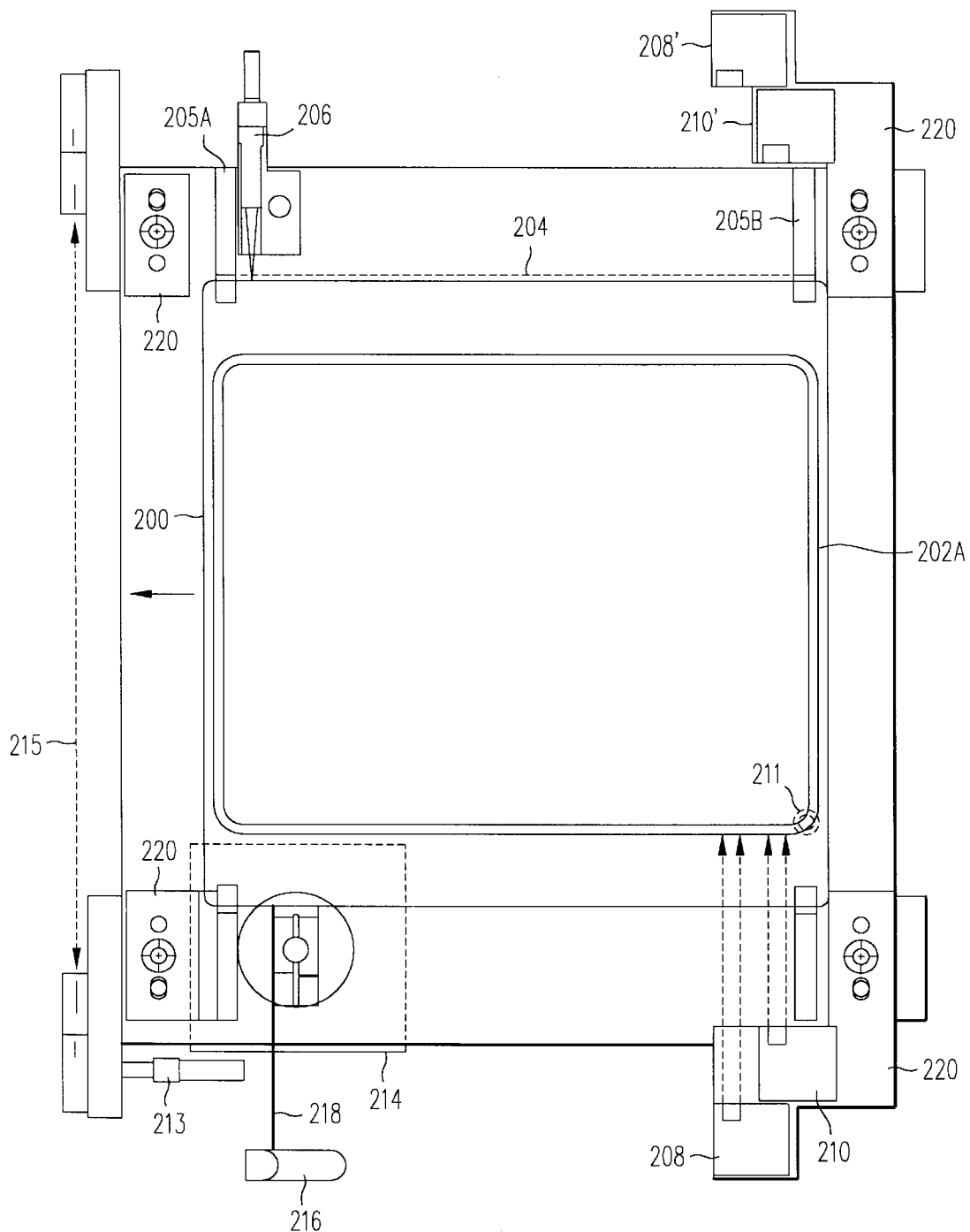
FIG. 2A is a plan view of an embodiment of loading station 120 supporting a five-inch mask 200.
Figure 2B:
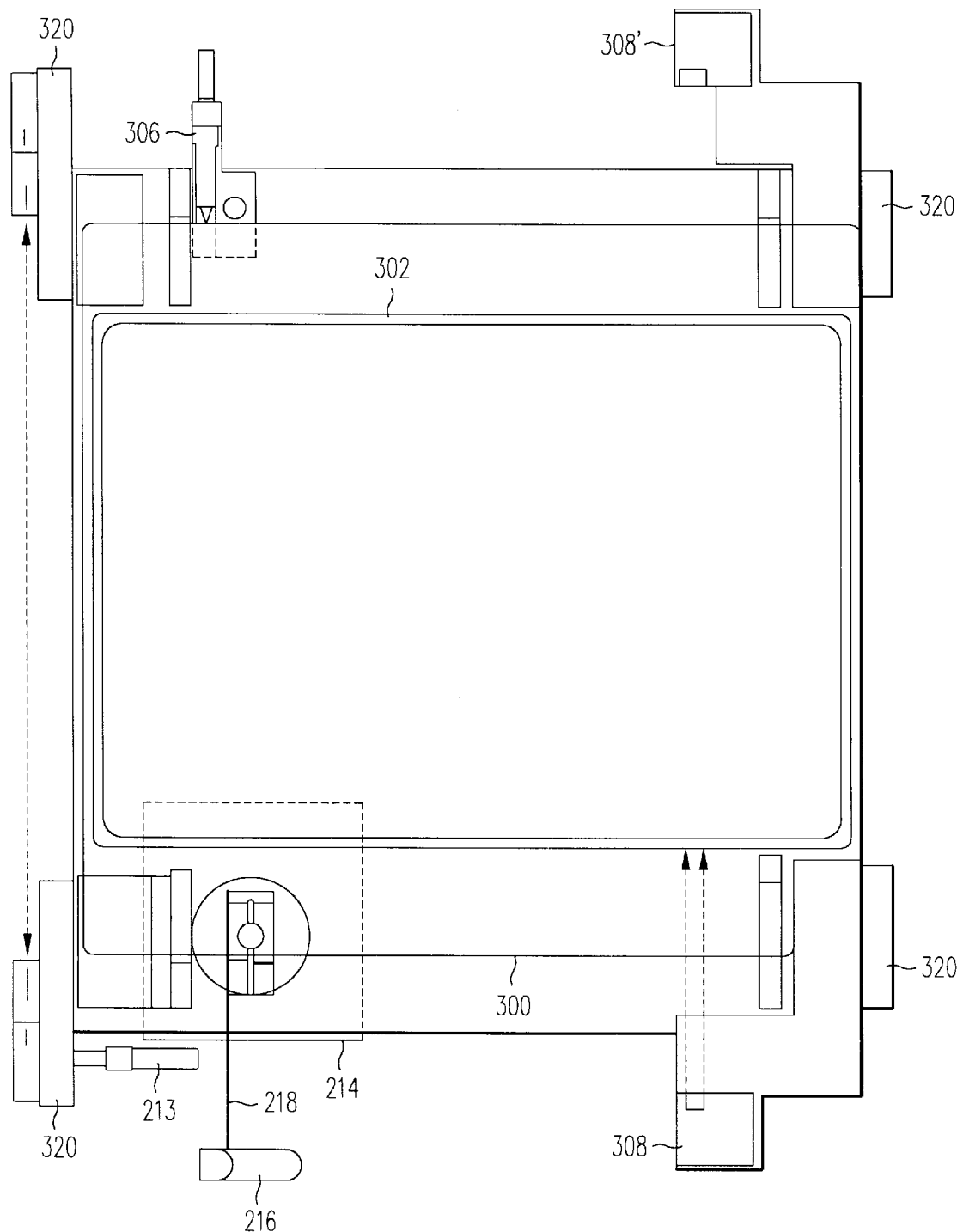
FIG. 2B is a plan view of loading station 120 of FIG. 2 supporting a six-inch mask 300.

FIGS. 2A and 2B are a plan view of an embodiment of loading station 120 supporting a five-inch mask 200. Mask 200 optionally includes a pellicle 202A attached to the top surface and a pellicle 202B attached to the bottom surface. Pellicles 202A and 202B conventionally include a fence surrounding the image area of mask 200. A transparent film (not shown) is stretched across the fence to protect mask 200 from damage and contamination. The use of pellicles to protect masks is well known in the art.

Once an operator places a mask 200 onto loading station 120, loading station 120 checks for proper mask orientation while precisely positioning mask 200. The position sensors that ensure proper orientation include a conventional diffuse optical sensor 206 and two conventional through-beam optical sensor pairs 208/208' and 210/210'.

Sensor 206 detects the presence of five-inch wafer 200. Sensor pair 208/208' detects the presence of pellicle 202A on the top surface of mask 200 if the light between sensors 208 and 208' is broken. Sensor pair 208/208' is positioned such that if wafer 200 includes pellicle 202A then sensor pair 208/208' will detect pellicle 202A even if mask 200 is oriented incorrectly (e.g., mask 200 is rotated 90 degrees). Sensor pair 210/210' also detects the presence of a pellicle 202A. However, sensor pair 210/210' is positioned so that the light between sensors 210 and 210' is broken only if pellicle 202A is oriented properly. An additional diffuse optical sensor 211 is positioned under pellicles 202A and 202B to ensure that wafer 200 is right-side up. Sensor 211 is more clearly depicted in FIG. 3.

The output signals from sensor 206, sensor pairs 208/208' and 210/210', and sensor 211 are combined, using conventional digital logic, and electrically connected to the robot controller. The digital logic is configured so that robot 130 cannot move if a mask 200 with a pellicle 202B on the bottom surface is incorrectly oriented on loading station 120.

Loading station 120 ensures that mask 200 is positioned properly by pushing mask 200 against a datum line 204 defined by supports 205A and 205B. When sensor 206 senses mask 200, a conventional stepper motor 214, connected to a pusher element 216 via a leaf spring 218, rotates a predetermined number of steps to position mask 200 against supports 205A and 205B. A diffuse optical sensor 213 identifies the home position of stepper motor 214. Four mask stops 220 limit the movement of mask 200 in directions parallel to datum line 204. In one embodiment, all portions of loading station 120 that contact mask 200 are fashioned from plastic material commercially available under the trademark "Teflon". Loading station 120 also includes a light-curtain array 215, which is described in connection with FIG. 4.

FIG. 2B is a plan view of loading station 120 of FIG. 1 supporting a six-inch mask 300. The operation of loading station 120 is substantially the same for five and six-inch masks. However, a different diffuse optical sensor 306 detects the presence of six-inch mask 300, a separate optical sensor pair 308/308' detects the presence of a pellicle 302, and stops 320 laterally confine mask 300.

Loading station 120 does not include an additional sensor to ensure that wafer 300 is properly oriented because conventional six-inch wafers do not include a pellicle on their bottom side. However, a mask orientation sensor may be provided if desired. In some embodiments information as to the presence of absence of a pellicle is conveyed to a microscope within mask-inspection system 100 to ensure that the microscope objective remains clear of the pellicle during inspection.

Figure 3:
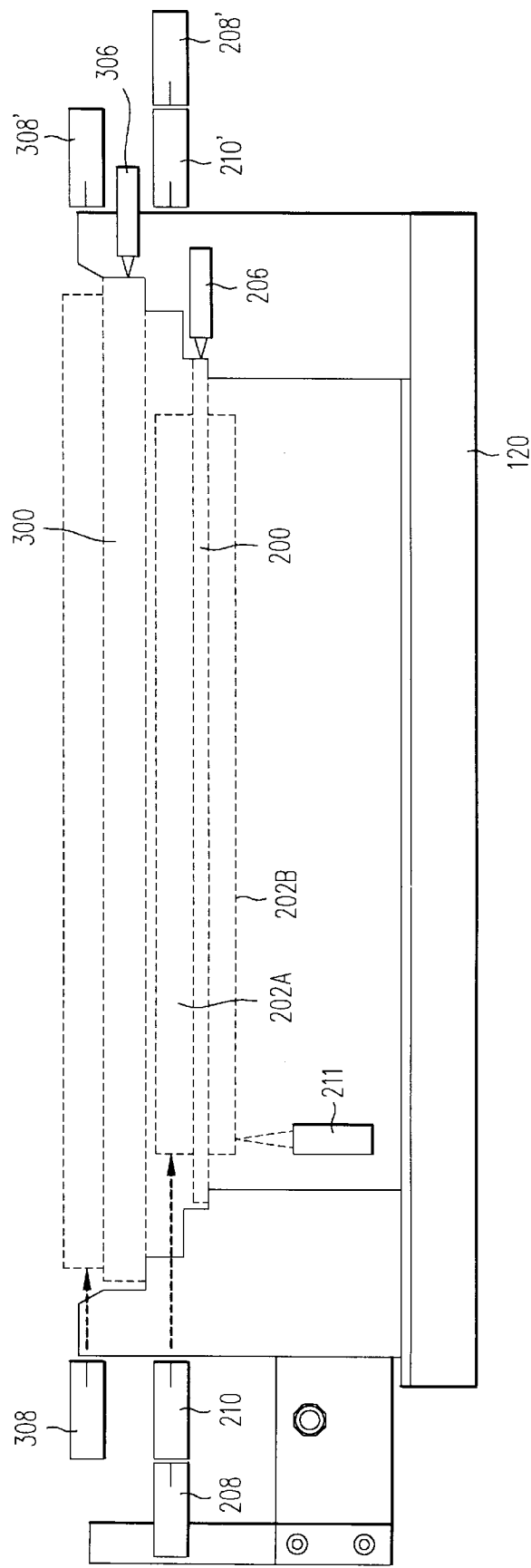
FIG. 3 is a view of loading station 120 from the side opposite robot 130.

FIG. 3 is a side elevation view of loading station 120 from the side opposite robot 130. FIG. 3 illustrates the positions of the various sensors relative to masks 200 and 300. Masks 200 and 300 are shown together for illustrative purposes only: loading station 120 is not intended to support them simultaneously. Consequently, the robot controller is configured to shut off robot 130 should sensors 206 and 306 simultaneously indicate the presence of both five and six-inch masks. Sensor 211, positioned beneath pellicles 202A and 202B, is adjusted to sense pellicle 202A should mask 200 be placed upside down. The smaller pellicle 202B is not detected when mask 200 is positioned right-side up.

Figure 4:
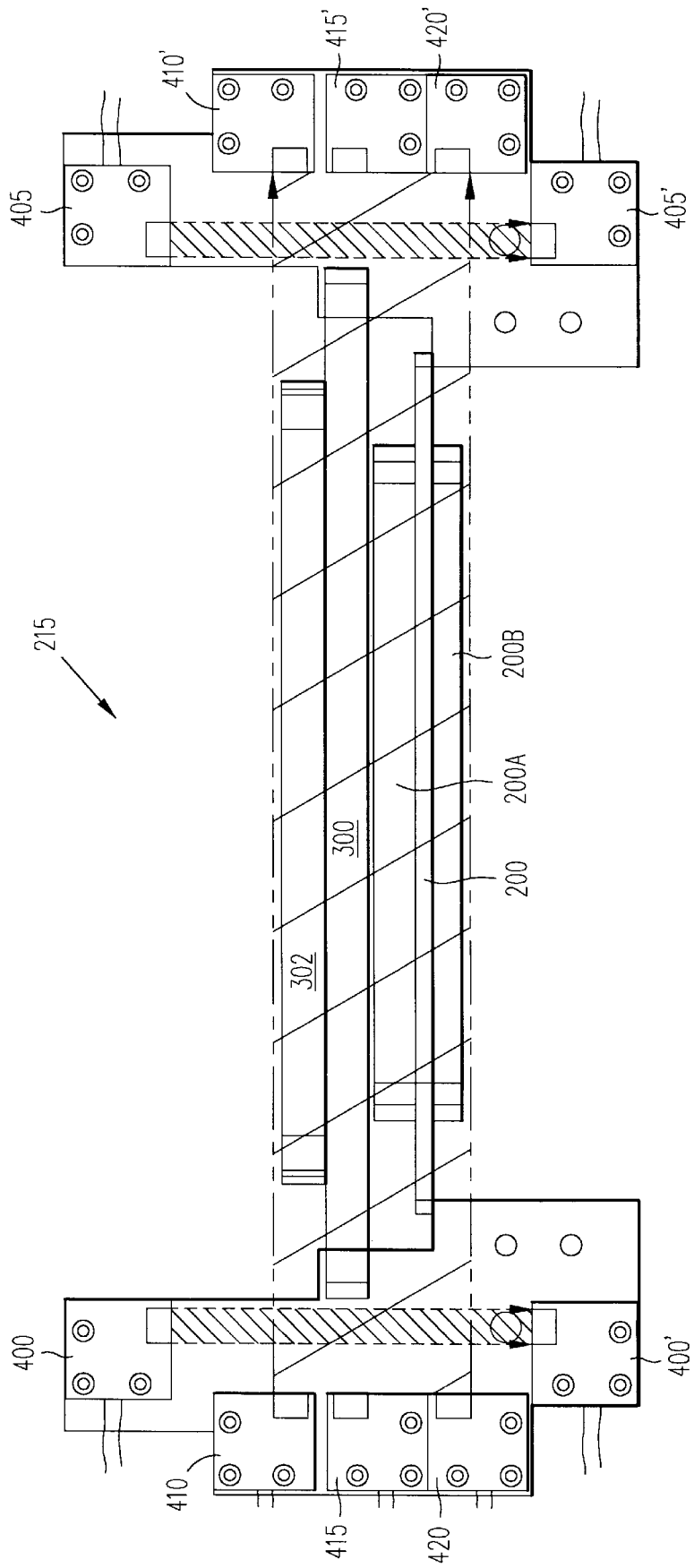
FIG. 4 illustrates the arrangement of light-curtain array 215 on loading station 120 as viewed from the direction of robot 130.

FIG. 4 illustrates the arrangement of light-curtain array 215 on loading station 120 as viewed from the direction of robot 130. Array 215 involves vertical through-beam optical sensor pairs 400/400' and 405/405' and similar horizontal sensor pairs 410/410', 415/415', and 420/420'. Robot 130 stops instantly if a vertical or horizontal light path defined by light-curtain array 215 is broken. Any substantial vertical or lateral displacement of mask support 150 will interfere with light-curtain array 215 and therefore stop robot 130. Light-curtain array 215 thus ensures that mask support 150 may only enter loading station 120 along a predefined path so that mask support 150 does not collide with one of masks 200 or 300 in the event of a robot-control failure.

Figure 5:
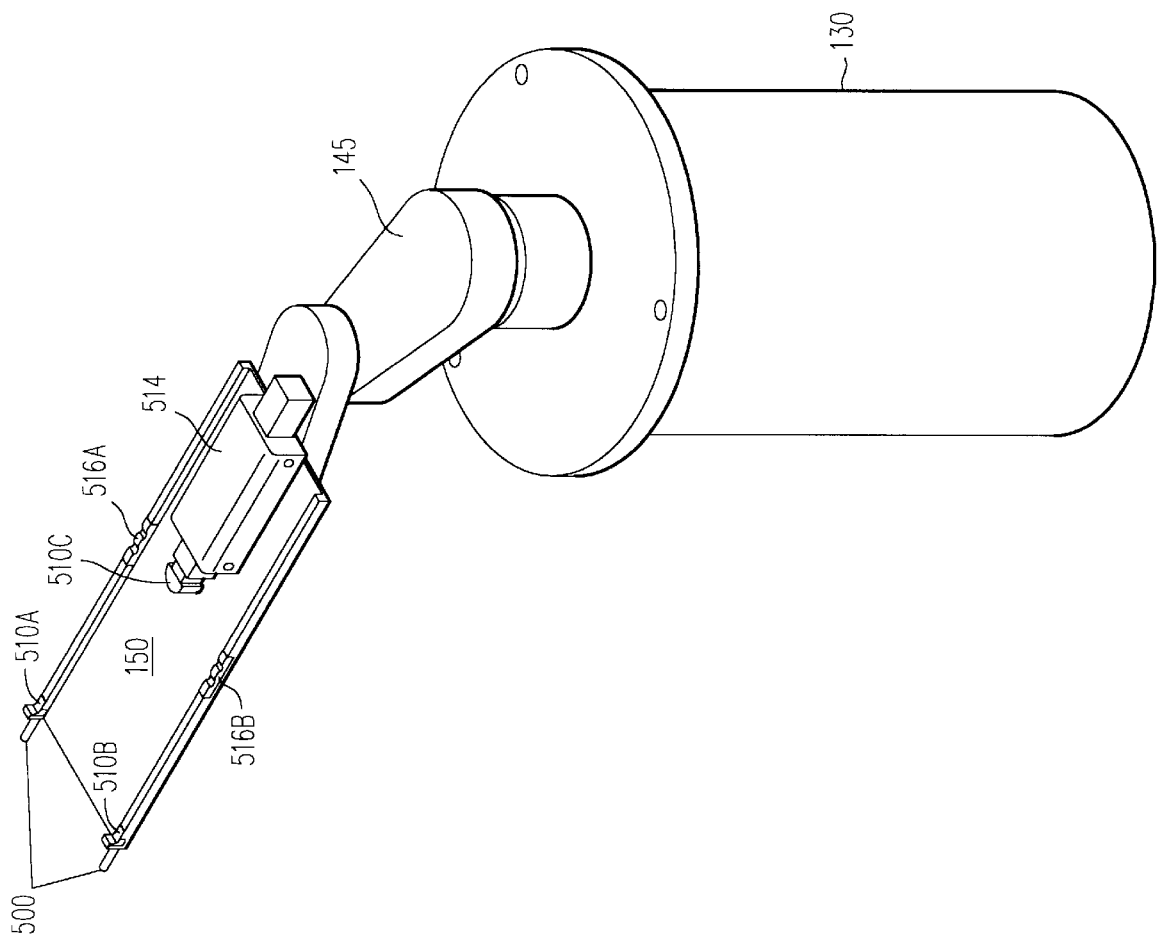
FIG. 5 depicts mask support 150 attached to transfer arm 145 of robot 130.

FIG. 5 depicts mask support 150 attached to transfer arm 145 of robot 130. Mask support 150 includes a pair of crash-prevention sensors 500, conventional diffuse optical sensors in one embodiment, that are electrically connected to the robot controller to prevent mask support 150 from collisions. Should either of crash-prevention sensors 500 detect an object, the robot controller quickly disables robot 130 to prevent mask damage.

Mask support 150 further includes retaining members 510A, 510B, and 510C. Member 510C is attached to an actuator 514 that pushes member 510C toward members 510A and 510B. As discussed below in connection with FIGS. 6 and 7, members 510A, 510B, and 510C clamp an article (e.g., mask 200) between them to secure the article as the article is moved. Mask support 150 also includes a pair of rests 516A and 516B upon which a conveyed article rests. As with loading station 120, all elements of mask support 150 that contact a conveyed mask are preferably made of or coated with Teflon.

Figure 6:
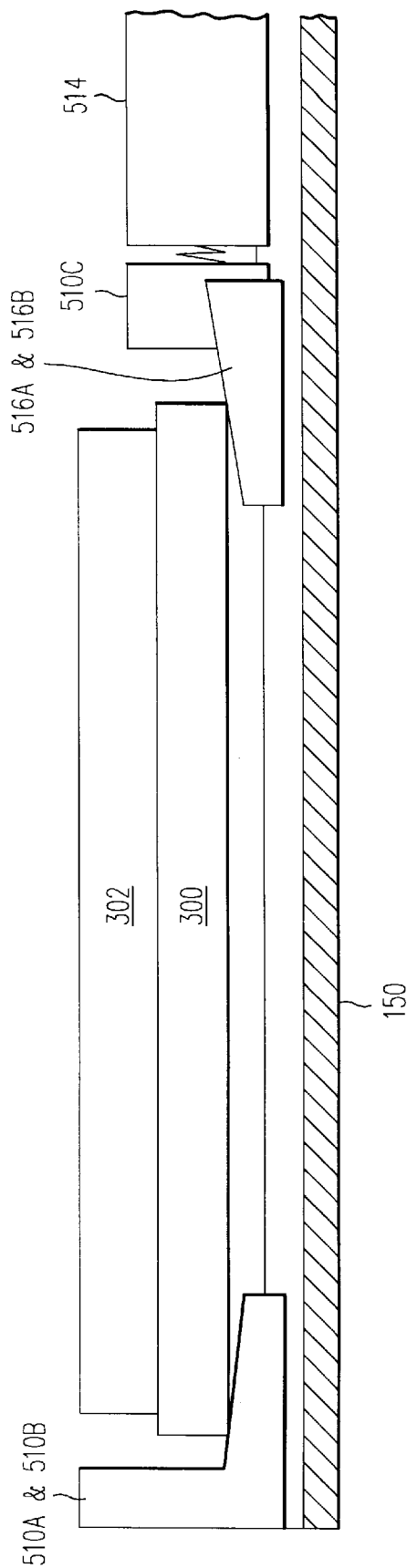
FIG. 6 is a cut-away side view of mask support 150.

FIG. 6 is a cut-away side view of mask support 150. In one embodiment the body of mask support 150 is fashioned of stainless steel, providing excellent rigidity and corrosion resistance. Member 510C moves against an article (e.g., mask 200 or mask 300) to push the article against the vertical surfaces of members 510A and 510B. The supporting surfaces of retaining members 510A and 510B are chamfered one to two degrees; rests 516A and 516B are higher than members 510A and 510B and are chamfered three to five degrees. These chamfers encourage supported articles to slide away from member 510C and toward members 510A and 510B prior to clamping. In one embodiment, robot 130, based on information from sensors 206 and 306, positions member 510C to provide approximately 80 thousandths of an inch clearance between member 510C and the appropriate one of masks 200 and 300 prior to removing the selected mask from loading station 120.

Figure 7:
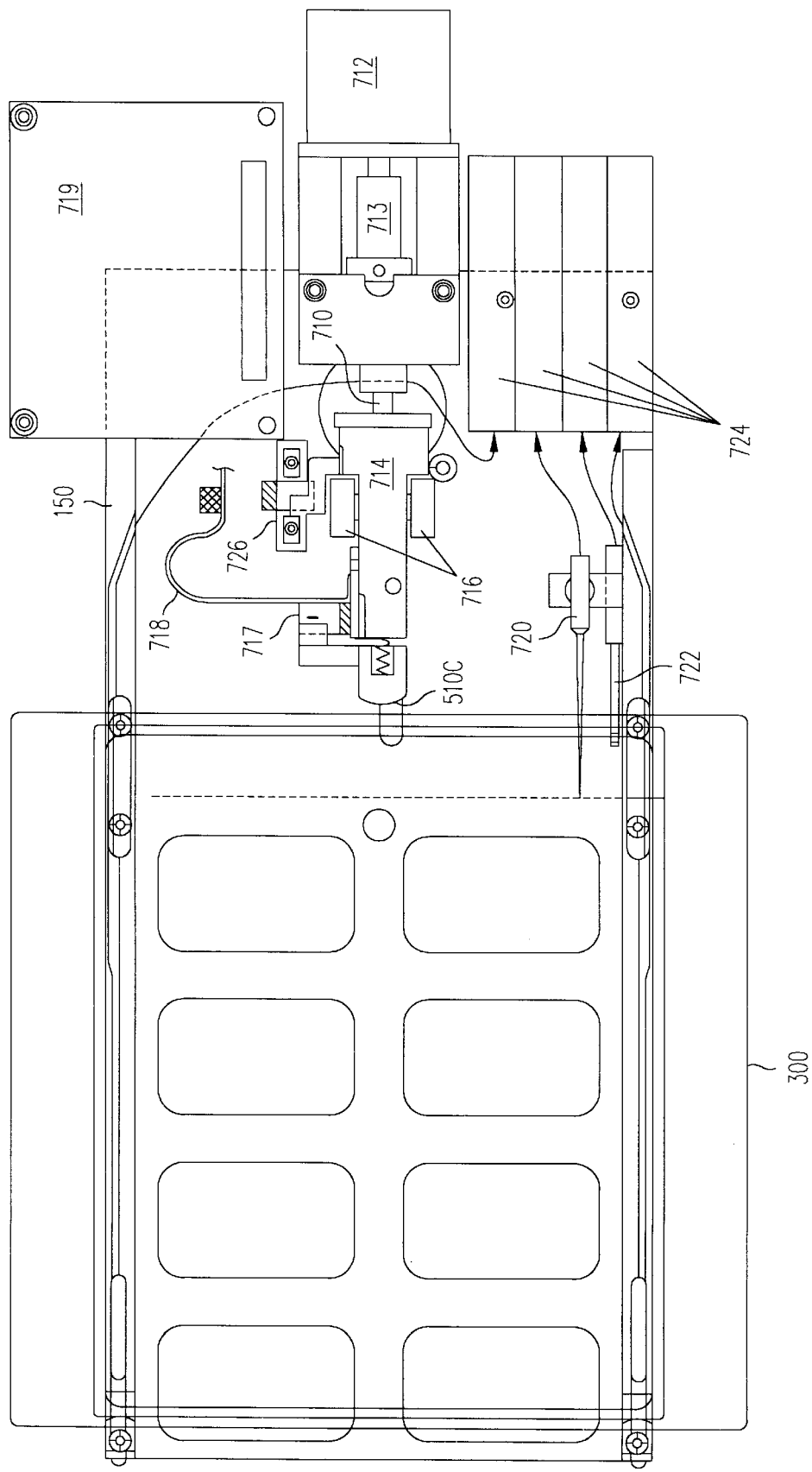
FIG. 7 is a plan view of mask support 150 illustrated supporting a six-inch mask 300.

FIG. 7 is a plan view of mask support 150 shown supporting six-inch mask 300. Member 510C is activated via a lead screw 710 by a conventional stepper motor 712 and coupling 713. A carriage 714 for member 510C includes a pair of bearings 716 that keep carriage 714 from rotating along with lead screw 710, thereby transferring the rotational motion of lead screw 710 into the linear motion of carriage 714. Carriage 714 conventionally includes a limiter (not shown) that keeps carriage 714 from leaving lead screw 710. All bearings of the mask transfer system are cleaned and relubricated per MIL.SPEC. DOD-L-85645, TYP.1, to reduce particle emissions. Cleaned bearings may alternatively be relubricated using Braycote 1632 available from Castrol, Inc.

An un-clamp sensor 717 is electrically connected to the robot controller via a flexible cable 718 and a PC board 719. Un-clamp sensor 717 includes a optical sensor that senses the presence of a flag attached to element 510C when an article is clamped between members 510A, 510B, and 510C. The robot controller is programmed, using conventional means, to immediately pause robot 130 should un-clamp sensor 717 indicate an unclamped condition while mask support 150 is supporting a mask. In addition, sensor 717 must indicate a clamped state before robot 130 can remove a mask from either of the loading station 120 or inspection stage 140. When securing a mask, un-clamp sensor 717 causes stepper motor 712 to switch from a driving torque to a holding torque. The position of sensor 717 may be adjusted to ensure that the clamping force of element 510C is high (due to an internal spring) at the switching point. This ensures that a clamped mask will not fly off support 150 should the mask become unclamped while robot 130 is in motion. A final sensor 726 is a conventional home-position sensor for stepper motor 712.

A diffuse optical sensor 720 detects the presence of either a five or six-inch mask. A second sensor 722, a reflective fiber optic sensor, detects only six-inch masks. The output signals from sensors 720 and 722 are combined, using conventional digital logic, and electrically connected through PC board 719 to the robot controller. The combined signals indicate whether mask support 150 contains a mask and, if so, whether the detected mask is a five-inch mask (sensor 720 alone detects a mask) or a six-inch mask (both of sensors 720 and 722 detect a mask). Sensors 720 and 722 are connected to PC board 719 via dedicated amplifiers 724. (The remaining two amplifiers connect crash-prevention sensors 500 to the robot controller via PC board 719.) Amplifiers 724 are available from Sunx, Inc.

Figure 8:
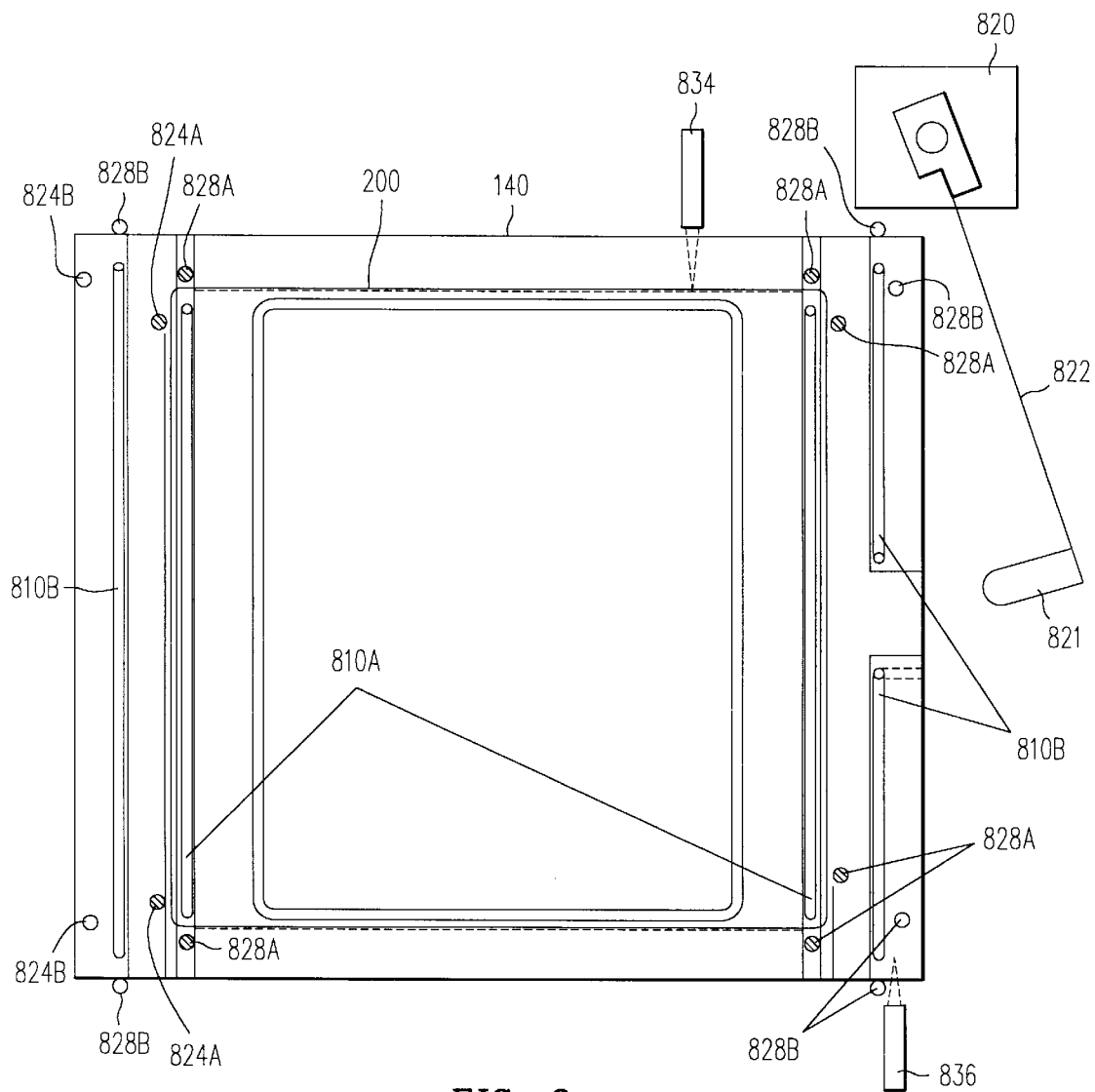
FIG. 8 is a top view of inspection stage 140 supporting a five-inch mask 200.

FIG. 8 is a top view of inspection stage 140 supporting five-inch mask 200. Inspection stage 140 includes conventional vacuum slots 810A and 810B. Robot 130 loads wafer 200 onto inspection stage 140 and returns to a home position. A stepper motor 820, connected to a pusher 821 via a leaf spring 822, then rotates a predetermined number of steps to urge mask 200 against a pair of datum pins 824A.

Having loaded and positioned mask 200 onto inspection stage 140, the system applies vacuum to vacuum slots 810A to secure mask 200 to inspection stage 140. A conventional reflective fiber optic sensor 834 detects the presence of five-inch masks; a similar sensor 836 detects the presence of six-inch masks. Another sensor (not shown) is provided to detect the home position of stepper motor 820.

Inspection stage 140 includes several pins 828A that, with datum pins 824A, ensure mask 200 remains over slots 810A should inspection stage 140 experience a shock, vibration, and/or loss of vacuum. Pins 828A are important because without them a dislocated mask could expose one of vacuum slots 810A. Embodiments of inspection stage 140 that include vacuum sensors could mistake an exposed vacuum slot for an empty inspection stage 140. Such a mistake could be disastrous if, for example, the mask transfer system attempted to load a second mask. A pair of datum pins 824B and six pins 828B provide the same functions as pins 824A and 828A but for six-inch mask 300. In one embodiment, all surfaces of inspection stage 140 that contact masks are either made of or are coated with Teflon.

Figure 9A:
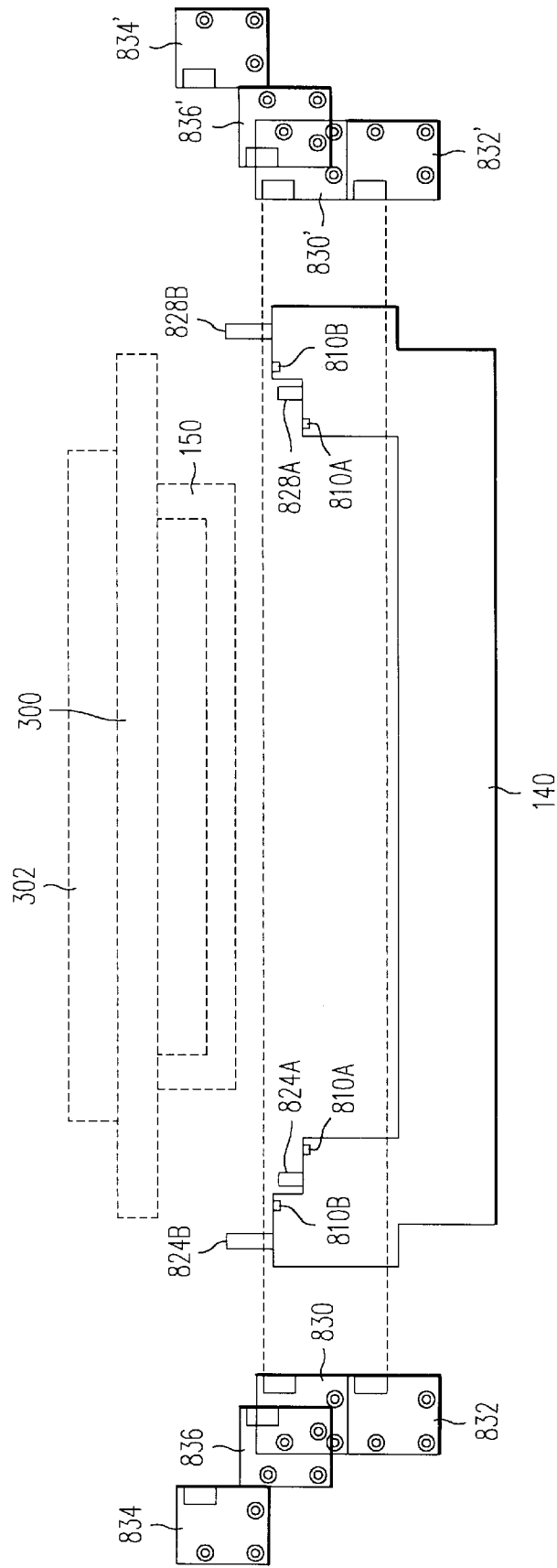
FIGS. 9A and 9B show inspection stage 140 from the direction of robot 130.
Figure 9B:
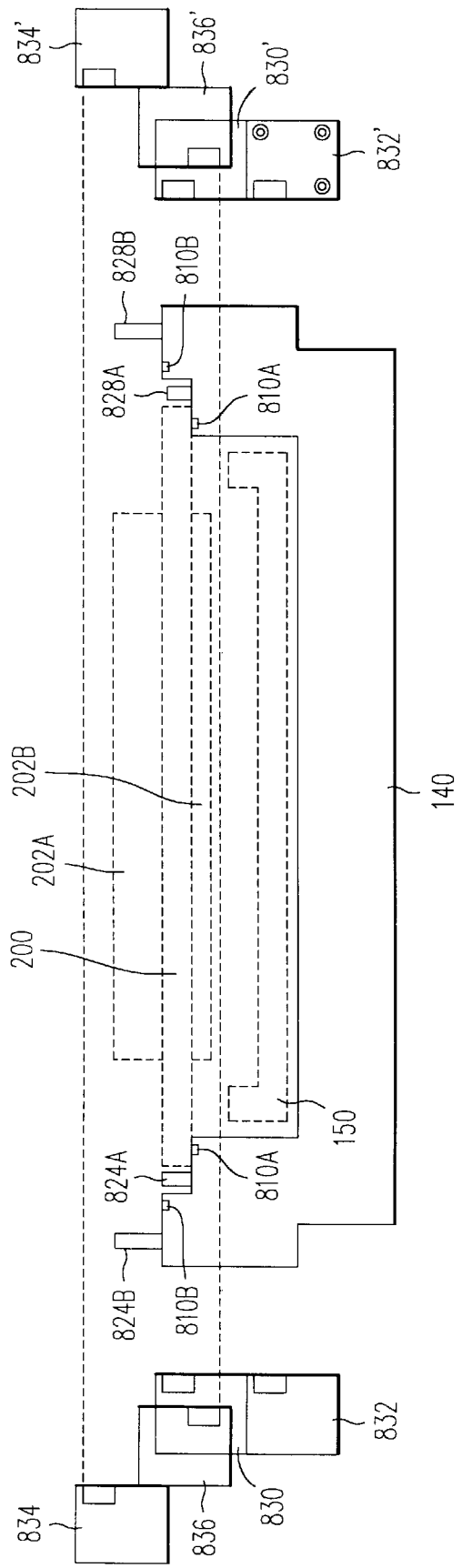

FIGS. 9A and 9B each show a side elevation view inspection stage 140 from the direction of robot 130. Beginning with FIG. 9A, inspection stage 140 includes two conventional through-beam optical sensor pairs 830/830' and 832/832' that together create a light curtain. This light curtain ensures that mask support 150 does not collide with inspection stage 140 while loading a mask. As depicted in FIG. 9B, two additional through-beam optical sensor pairs 834/834' and 836/836' create a second light curtain. When a mask is loaded onto inspection stage 140 this second set of sensor pairs protects the loaded mask from being struck by mask support 150.

One embodiment of the automated mask-transfer system in accordance with the present invention is adapted to remove an article (e.g., a reticle, mask, or wafer) from a conventional cartridge for placement onto inspection stage 140. An example of one such cartridge is described in detail in a patent to Abe et al. entitled "Container for Holding Substrate," U.S. Pat. No. 4,422,547, issued Dec. 27, 1983, which is incorporated herein by reference.

FIG. 10 depicts a five-inch mask cartridge 1000 and a six-inch mask cartridge 1010. Mask support 150 and crash-prevention sensors 500 are illustrated for each cartridge to show the placement of mask support 150 relative to each mask. Mask support 150 enters either of cartridges 1000 or 1010 along a path normal to the depiction of FIG. 10. Crash-prevention sensors 500 are positioned to stop robot 130 should the vertical or horizonal alignment of mask support 150 be incorrect.

Figure 11:
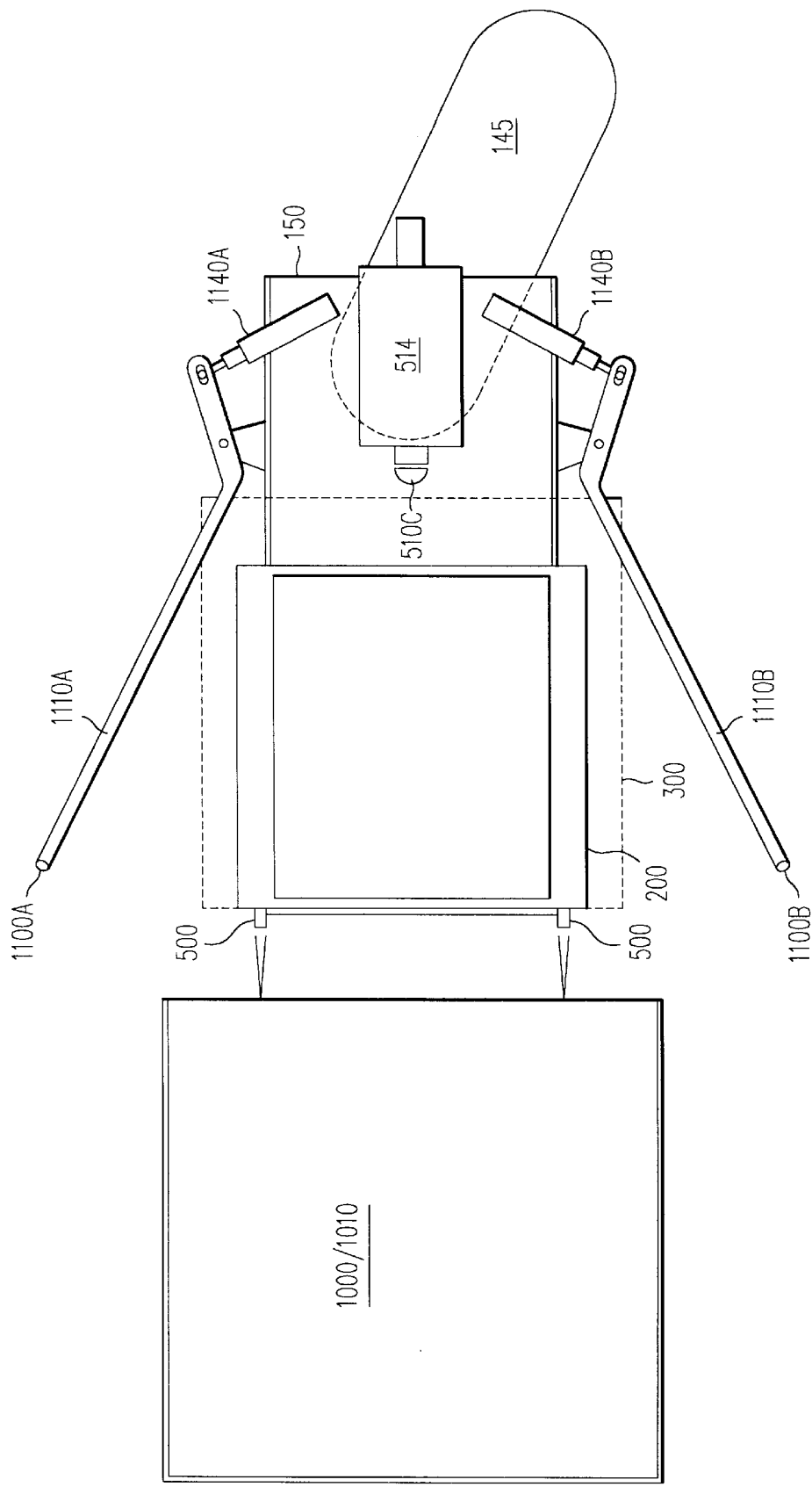
FIG. 11 is a top view of an embodiment of mask support 150 configured to transfer mask 200 (300) to and from cartridge 1000 (1010).

FIG. 11 is a top view of an embodiment of mask support 150 configured to transfer mask 200 (300) to and from cartridge 1000 (1010). The embodiment of FIG. 11 is in many ways similar to the embodiment of FIGS. 5–7, like-numbered elements being the same. In the embodiment of FIG. 11, however, mask support 150 includes a pair of retaining members 1100A and 1100B connected to respective retaining-member arms 1110A and 1110B. In the embodiment of FIG. 11 members 510A and 510B are replaced with rests (not shown) similar to rests 516A and 516B but with a chamfer of one to two degrees. Retaining members 1100A and 1100B substitute for the vertical clamping surfaces of members 510A and 510B in the embodiment of FIG. 6. The third mask-retaining member 510C is connected to clamp actuator 514. The embodiment of FIG. 11 is adapted for use with either cartridges or with manual loading systems as described above.

Mask retaining members 1100A and 1100B may be moved from a first position (FIG. 11) to a second position (FIG. 12) via a pair of arm actuators 1140A and 1140B. Each of actuators 1140A and 1140B is controlled by a pneumatic cylinder at the direction of the robot controller. Moving members 1100A and 1100B to the position depicted in FIG. 11 allows mask support 150 to more easily enter the confined space within cartridge 1000 (1010).

Figure 12:
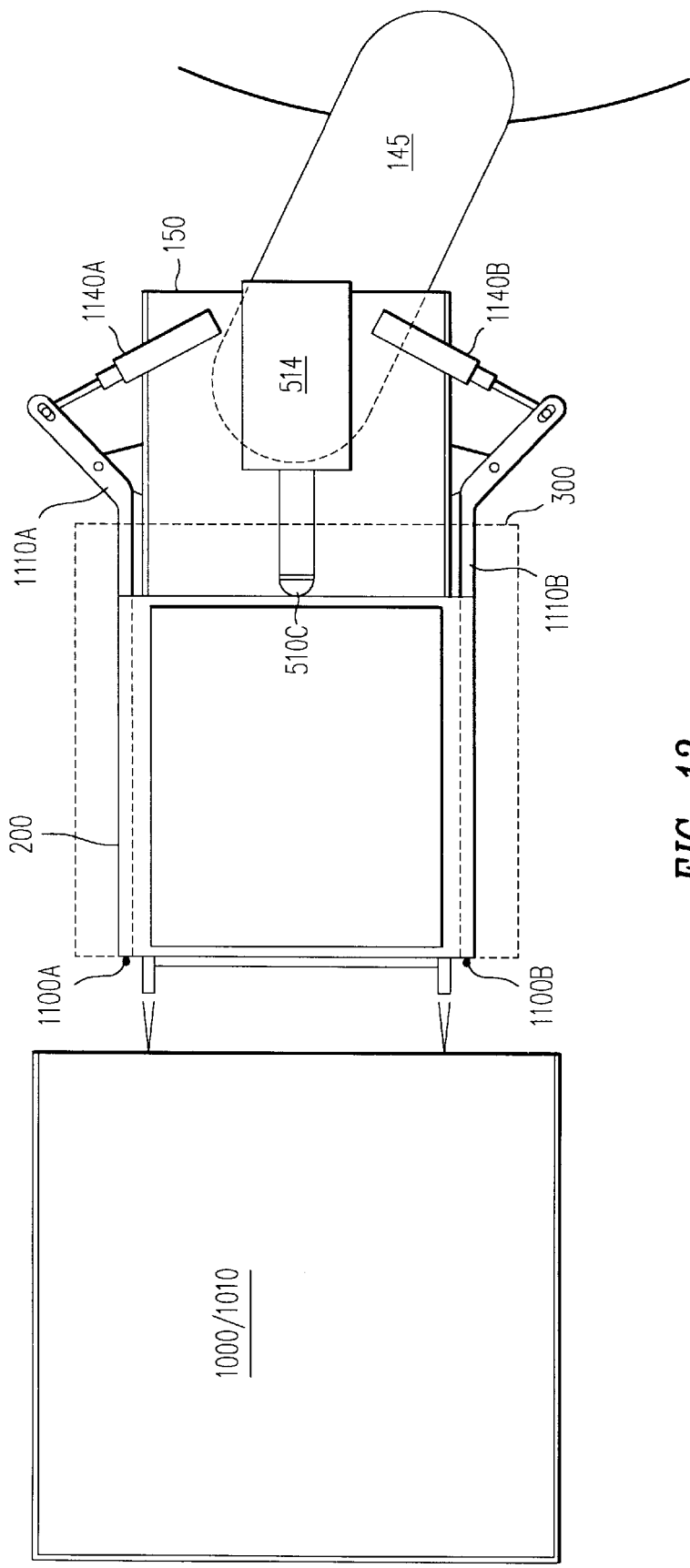
FIG. 12 shows a top view of mask support 150 shown in FIG. 11, but with mask 200 clamped.

FIG. 12 shows a top view of the embodiment of mask support 150 shown in FIG. 11, but with mask 200 clamped. Upon removing mask 200 from cartridge 1000, each of mask-retaining members 1100A and 1100B moves into the position shown in FIG. 12. Clamp actuator 514 then pushes mask-retaining member 510C against mask 200 to secure mask 200 between mask-retaining members 1100A, 1100B and 510C. Mask 200 remains thus secured until mask 200 is safely positioned on inspection stage 140. Similarly, in transferring mask 200 from inspection stage 140 to cartridge 1000, mask 200 remains secured until mask 200 is about to be inserted into cartridge 1000. Mask support 150 operates in the same manner for six-inch mask 300, which is depicted using dashed lines for size comparison.

FIG. 13 is a top view of mask support 150 positioning mask 200 onto vacuum slots 810A of inspection stage 140. Inspection stage 140 includes datum pins 824A that are used to orient mask 200 as discussed above in connection with FIG. 8. Robot 130 withdraws member 510C, lowers mask 200 onto inspection stage 140, and then withdraws mask support 150 as described in connection with FIGS. 8, 9A, and 9B. Vacuum is then applied to vacuum slots 810A to secure mask 200 to inspection stage 140. Finally, mask support 150 is removed from the vicinity of inspection stage 140 to a home position so that mask 200 may be inspected.

Once mask 200 has been inspected, mask 200 is transferred from inspection stage 140 back to cartridge 1000 by reversing the steps described in connection with FIGS. 8–12. The transfer of mask 300 is identical to that of mask 200: a description of the transfer of mask 300 has therefore been omitted for brevity.

The above-described embodiments include a number of sensors that interrupt robot 130 in the event of a robot failure or some other unsafe condition. These sensors include the light curtain across opening 110, five light curtains on loading station 120, and four light curtains on inspection stage 140. Each of these sensors is hard wired through a conventional amplifier, available from Sunx, to a "Motor-Off" terminal of the robot controller. The output signals from the sensors are logically ORed together so that any one of the sensors can immediately shut off robot 130.

Two crash-position sensors and an un-clamp sensor on mask support 150 can also immediately shut off robot 130. However, in one embodiment those sensors are not connected to the "Motor-Off" terminal, but are instead connected to the robot controller via an instruction bus. PC board 719 logically combines the signals from the two crash-position sensors and un-clamp sensor and translates the signals into a simple instruction for shutting down robot 130 in the event of a potential collision or an unclamped condition. The output signals from these sensors may be logically combined in any number of ways to achieve the functions described herein, as will be readily understood by those of skill in the art.

The above-described embodiments also include a number of sensors that provide information that enables inspection system 100 to accommodate differently sized masks, transfer masks with minimal danger of damage, and "remember" the position and placement of a mask, if any, in the event of a shut down. For example, loading station 120 includes two mask-detection sensors, three pellicle-detection sensors, and a home position sensor for stepper motor 214; mask support 150 includes two mask-detection sensors and a home position sensor for stepper motor 712; and inspection stage 140 includes two mask-detection sensors and a home position sensor for stepper motor 820. The output signals from these sensors may be logically combined in any number of ways to achieve the functions described herein, as will be readily understood by those of skill in the art.

While the present invention has been described in connection with specific embodiments, variations of these embodiments will be obvious to those of ordinary skill in the art. For example, while described in connection with five and six-inch masks, the invention may be adapted for use with other sizes of masks or other types and sizes of substrates. Furthermore, while each of the sensors used in the above-described embodiments is optical, many other types and configurations of sensors may be used. Therefore, the spirit and scope of the appended claims should not be limited to the foregoing description of the preferred versions.

What is claimed is:

1. A system for transferring an article of the type having a bottom surface and at least one edge defining a plurality of edge points from a first location to a second location, the system comprising:

a robot having a moveable arm;

a support for retaining the article the support being mounted on the arm of the robot for rotational and translational movement thereby and including:

first and second article-retaining members having respective first and second edge-point contact areas;

an actuator connected to the first article-retaining member and configured to urge the first article-retaining member against one of the edge points and to clamp the article between the first and second article-retaining members; and an un-clamp sensor connected to at least one of the first and second article-retaining members, the un-clamp sensor configured to indicate when the article is unclamped between the first and second article-retaining members; and means located at one of the first and second locations for preventing a collision between the support and the article at that location.

2. The system of claim 1, wherein the support further comprises a third article-retaining member, wherein the support is configured to clamp the article between the first, second, and third article-retaining members.

3. The system of claim 1, wherein the support further comprises a second actuator connected to the second article-retaining member, the second actuator configured to move the second article-retaining member from a first position to a second position.

4. The system of claim 3, further comprising an arm connected to the second actuator and the second article-retaining member.

5. The system of claim 3, wherein the first-mentioned actuator clamps the article when the second article-retaining member is in the second position.

6. The system of claim 1, wherein the article is a mask.

7. The system of claim 6, further comprising a pellicle sensor positioned at one of the first and second locations to detect the presence of a pellicle on the mask.

8. The system of claim 1, wherein the support further comprises a support floor upon which the article rests, the support floor comprising at least one rest positioned to contact the bottom surface of the article and to provide a stable seat for the article.

9. The system of claim 8, wherein the rest comprises Teflon.

10. The system of claim 1, wherein the support further comprises at least one collision sensor configured to sense objects adjacent the support.

11. The system of claim 1, wherein the first location comprises a loading station configured to receive the article.

12. The system of claim 11, wherein the article is enclosed within a cartridge.

13. The system of claim 11, wherein the loading station comprises a datum line for positioning the article.

14. The system of claim 13, wherein the loading station further comprises a pusher element for urging an edge of the article against the datum line.

15. The system of claim 11, wherein the means for preventing a collision comprises a light curtain.

16. The system of claim 11, wherein the loading station further comprises a pellicle sensor.

17. The system of claim 11, wherein the loading station further comprises an article-orientation sensor.

18. The system of claim 1, wherein the second location comprises an inspection stage. station to the inspection stage.

19. A system for positioning a mask for inspection, the system comprising:
   a loading station configured to receive the mask, the loading station including a mask-size sensor, a mask-orientation sensor, and a pellicle sensor;
   a robot including:
      a moveable arm;
      a support for retaining the mask, the support being mounted on the arm and moveable thereby with translational and rotational motion and including:
         first, second, and third mask-retaining members having respective first, second and third mask-edge contact areas;
         an actuator connected to the first mask-retaining member and configured to urge the first mask-retaining member against one of the mask edges to clamp the mask between the first, second and third mask-retaining members;
      a mask sensor positioned to detect the presence of a mask on the support;
      a collision sensor configured to sense objects adjacent the support; and
      an un-clamp sensor connected to at least one of the first, second and third mask-retaining members; and
   an inspection stage, wherein the robot is configured to transfer the mask from the loading station to the inspection stage.

20. The system of claim 19, wherein the support further comprises a second actuator connected to the second mask-retaining member, the second actuator configured to move the second mask-retaining member from a first position to a second position.

21. The system of claim 20, further comprising an arm connected to the second actuator and the second mask-retaining member.

22. The system of claim 19, wherein the mask is enclosed within a cartridge.

23. The system of claim 19, wherein the loading station further comprises a pusher element for urging an edge of the mask against a datum line.

24. The system of claim 19, wherein the loading station comprises a collision sensor configured to prevent the support from colliding with the mask.

25. The system of claim 24, wherein the loading station collision sensor is a light curtain.

26. The system of claim 19, wherein the inspection stage further comprises a mask-size sensor, a datum line, and means for positioning an edge of the mask along the datum line.

27. The system of claim 26, wherein the inspection stage further comprises a first light curtain for preventing a collision between the mask support and the inspection stage.

28. The system of claim 27, wherein the inspection stage further comprises a second light curtain for preventing a collision between the mask support and a mask loaded onto the inspection stage.

* * * * *

UNITED STATES PATENT AND TRADEMARK OFFICE
CERTIFICATE OF CORRECTION

PATENT NO. : 5,980,187
DATED : November 9, 1999
INVENTOR(S) : Yuli Verhovsky

It is certified that error appears in the above-identified patent and that said Letters Patent is hereby corrected as shown below:

<u>Title page,</u>
Item [22], the filing date for the above-identified patent application is April 16, 1997.

Signed and Sealed this

Thirtieth Day of July, 2002

Attest:

Attesting Officer

JAMES E. ROGAN
Director of the United States Patent and Trademark Office